(12) United States Patent
Seo

(10) Patent No.: US 11,380,595 B2
(45) Date of Patent: Jul. 5, 2022

(54) SEMICONDUCTOR WAFER, METHOD FOR SEPARATING THE SEMICONDUCTOR WAFER, SEMICONDUCTOR CHIP, AND SEMICONDUCTOR PACKAGE INCLUDING THE SEMICONDUCTOR CHIP

(71) Applicant: SK hynix Inc., Icheon-si (KR)

(72) Inventor: Hyun Chul Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/081,796

(22) Filed: Oct. 27, 2020

(65) Prior Publication Data

US 2022/0013418 A1    Jan. 13, 2022

(30) Foreign Application Priority Data

Jul. 9, 2020  (KR) ................ 10-2020-0084701

(51) Int. Cl.
| | | |
|---|---|---|
| *H01L 21/78* | (2006.01) | |
| *H01L 21/66* | (2006.01) | |
| *H01L 23/31* | (2006.01) | |
| *H01L 25/065* | (2006.01) | |
| *H01L 23/29* | (2006.01) | |

(52) U.S. Cl.
CPC .......... *H01L 22/32* (2013.01); *H01L 23/3171* (2013.01); *H01L 25/0657* (2013.01); *H01L 21/78* (2013.01); *H01L 23/293* (2013.01); *H01L 2225/0651* (2013.01); *H01L 2225/06562* (2013.01)

(58) Field of Classification Search
CPC ... H01L 23/3171; H01L 23/293; H01L 22/32; H01L 25/0657; H01L 21/78; H01L 2225/0651; H01L 2225/06562
See application file for complete search history.

(56) References Cited

U.S. PATENT DOCUMENTS

| | | | |
|---|---|---|---|
| 8,710,677 B2 * | 4/2014 | Lee ...................... | H01L 24/49 257/777 |
| 2014/0175638 A1 * | 6/2014 | Kim .................... | H01L 25/0657 257/737 |
| 2017/0278769 A1 * | 9/2017 | Liu ...................... | G01L 19/14 |
| 2018/0277456 A1 * | 9/2018 | Abe .................... | H01L 24/06 |

\* cited by examiner

*Primary Examiner* — Timor Karimy
(74) *Attorney, Agent, or Firm* — William Park & Associates Ltd.

(57) ABSTRACT

A semiconductor wafer includes a first chip region and a second chip region spaced apart from each other by a scribe lane region. The semiconductor wafer also includes a test pad disposed in the scribe lane region. The semiconductor wafer additionally includes a protective layer partially covering the first chip region, the second chip region, and the scribe lane region, wherein the protective layer covers a portion of the test pad adjacent to the first chip region and leaves a remaining portion of the first test pad exposed.

17 Claims, 10 Drawing Sheets

SEMICONDUCTOR WAFER, METHOD FOR SEPARATING THE SEMICONDUCTOR WAFER, SEMICONDUCTOR CHIP, AND SEMICONDUCTOR PACKAGE INCLUDING THE SEMICONDUCTOR CHIP

CROSS-REFERENCE TO RELATED APPLICATION

This application claims priority under 35 U.S.C. § 119(a) to Korean Patent Application No. 10-2020-0084701 filed on Jul. 9, 2020, which is incorporated herein by reference in its entirety.

BACKGROUND

1. Technical Field

This patent document relates to semiconductor technology, and more particularly, to a semiconductor wafer, a method for separating the semiconductor wafer into a plurality of semiconductor chips, the semiconductor chip separated from the semiconductor wafer, and a semiconductor package including the semiconductor chip.

2. Related Art

A semiconductor wafer may have a circuit and/or wiring structure formed over a substrate. The substrate may be formed of a semiconductor material such as silicon. The circuit and/or wiring structure may be formed by repeatedly performing a film deposition process, a mask and etching process, an ion implantation process, or the like.

The semiconductor wafer may include chip regions in which the circuit and/or wiring structure is integrated, and a scribe lane region which is positioned between the chip regions and used for dicing.

SUMMARY

Various embodiments are directed to a semiconductor wafer, a method for separating the semiconductor wafer, a semiconductor chip, and a semiconductor package including the semiconductor chip, capable of implementing a semiconductor package in which a plurality of semiconductor chips are stacked while preventing or mitigating process defects.

In an embodiment, a semiconductor wafer includes: a first chip region and a second chip region spaced apart from each other in a first direction by a first scribe lane region; a first test pad disposed in the first scribe lane region; and a protective layer disposed over the first chip region, the second chip region, and the first scribe lane region while partially covering the first scribe lane region. The protective layer covers a portion of the first test pad adjacent to the first chip region and leaves a remaining portion of the first test pad exposed.

In an embodiment, a method for separating a semiconductor wafer includes: providing a semiconductor wafer, the semiconductor wafer including a first chip region and a second chip region spaced apart from each other in a first direction by a first scribe lane region, a first test pad disposed in the first scribe lane region, and a protective layer partially covering the first chip region, the second chip region, and the first scribe lane region, while covering a portion of the first test pad adjacent to the first chip region and leaving a remaining portion of the first test pad exposed; and dicing the semiconductor wafer into a first semiconductor chip including the first chip region and a second semiconductor chip including the second chip region. Dicing of the semiconductor wafer includes separating the first test pad from the second semiconductor chip while the first test pad remains coupled with the first semiconductor chip.

In an embodiment, a semiconductor chip, which includes an upper surface, a first side surface, and a second side surface positioned opposite to the first side surface, includes: a test pad disposed on the upper surface and in an edge region adjacent to the first side surface; and a chip pad disposed on the upper surface and in an edge region adjacent to the second side surface. The test pad includes an overlapping portion overlapping the upper surface and a protruding portion protruding from the first side surface toward an outside of the semiconductor chip.

In an embodiment, a semiconductor package includes: a substrate; and a plurality of semiconductor chips stacked in a vertical direction over the substrate, each of the plurality of semiconductor chips having an upper surface, a first side surface, and a second side surface positioned opposite to the first side surface. Each of the plurality of semiconductor chips includes: a test pad disposed on the upper surface and in an edge region of the semiconductor chip adjacent to the first side surface; and a chip pad disposed on the upper surface and in an edge region of the semiconductor chip adjacent to the second side surface. The test pad for each of the semiconductor chips includes an overlapping portion overlapping the upper surface and a protruding portion protruding from the first side surface toward an outside of the semiconductor chip.

DETAILED DESCRIPTION

Figure 1:
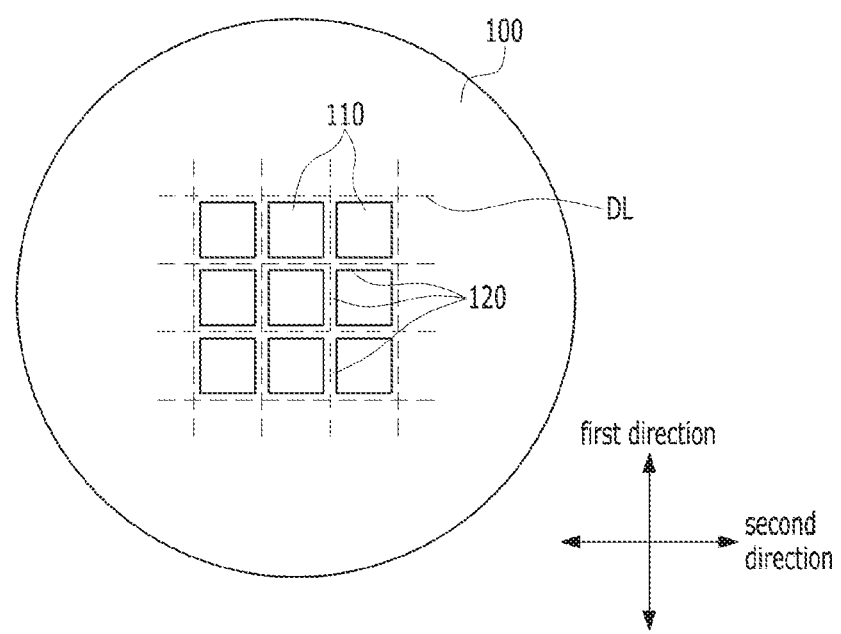
FIG. 1 is a plan view illustrating a semiconductor wafer according to an embodiment of the present disclosure.

Hereinafter, various examples of embodiments of the present disclosure will be described in detail with reference to the accompanying drawings.

The drawings might not be necessarily to scale and in some instances, proportions of at least some structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a plan view illustrating a semiconductor wafer according to an embodiment of the present disclosure.

Referring to FIG. 1, a semiconductor wafer 100 may include a plurality of chip regions 110 and a scribe lane region 120 disposed outside each of the plurality of chip regions 110.

The chip region 110 may be a region in which a plurality of semiconductor devices are integrated, and may have a square shape in a plan view. The plurality of chip regions 110 may be arranged in a matrix form along a first direction and a second direction while being spaced apart from each other. The second direction is different from the first direction. As shown, for example, the first and second directions are separated by 90 degrees. In the present embodiment, for convenience of description, only nine chip regions 110 are illustrated, but the present disclosure is not limited thereto. The number of the chip regions 110 arranged in the semiconductor wafer 100 may be variously modified.

The scribe lane region 120 may be a region for dicing to separate the semiconductor wafer 100 into a plurality of semiconductor chips. For convenience of description, a dicing line DL is illustrated by a dotted line in the scribe lane region 120. The dicing line DL may be a virtual dividing line for separating the semiconductor wafer 100 into a plurality of semiconductor chips. A physical dividing device (not shown) may pass through the dicing line DL during a dicing process. Alternatively, the dicing line DL may be a target of etching or laser irradiation light. The dicing line DL may extend in the first direction or the second direction. Because the scribe lane region 120 surrounds the chip region 110, the scribe lane region 120 may be disposed between adjacent chip regions 110 in the first direction and/or the second direction. That is, the chip regions 110 may be spaced apart from each other by the scribe lane region 120 in the first direction and/or the second direction. A test pad, for example, an electric parameter monitor (EPM) pad may be formed in the scribe lane region 120 for evaluating various manufacturing processes or characteristics of the semiconductor wafer 100. The test pad may be electrically separated from the chip region 110.

Hereinafter, the semiconductor wafer 100 of the present embodiment will be described in more detail with reference to FIGS. 2A and 2B in which two adjacent chip regions 110 in the first direction and their surroundings are enlarged.

Figure 2A:
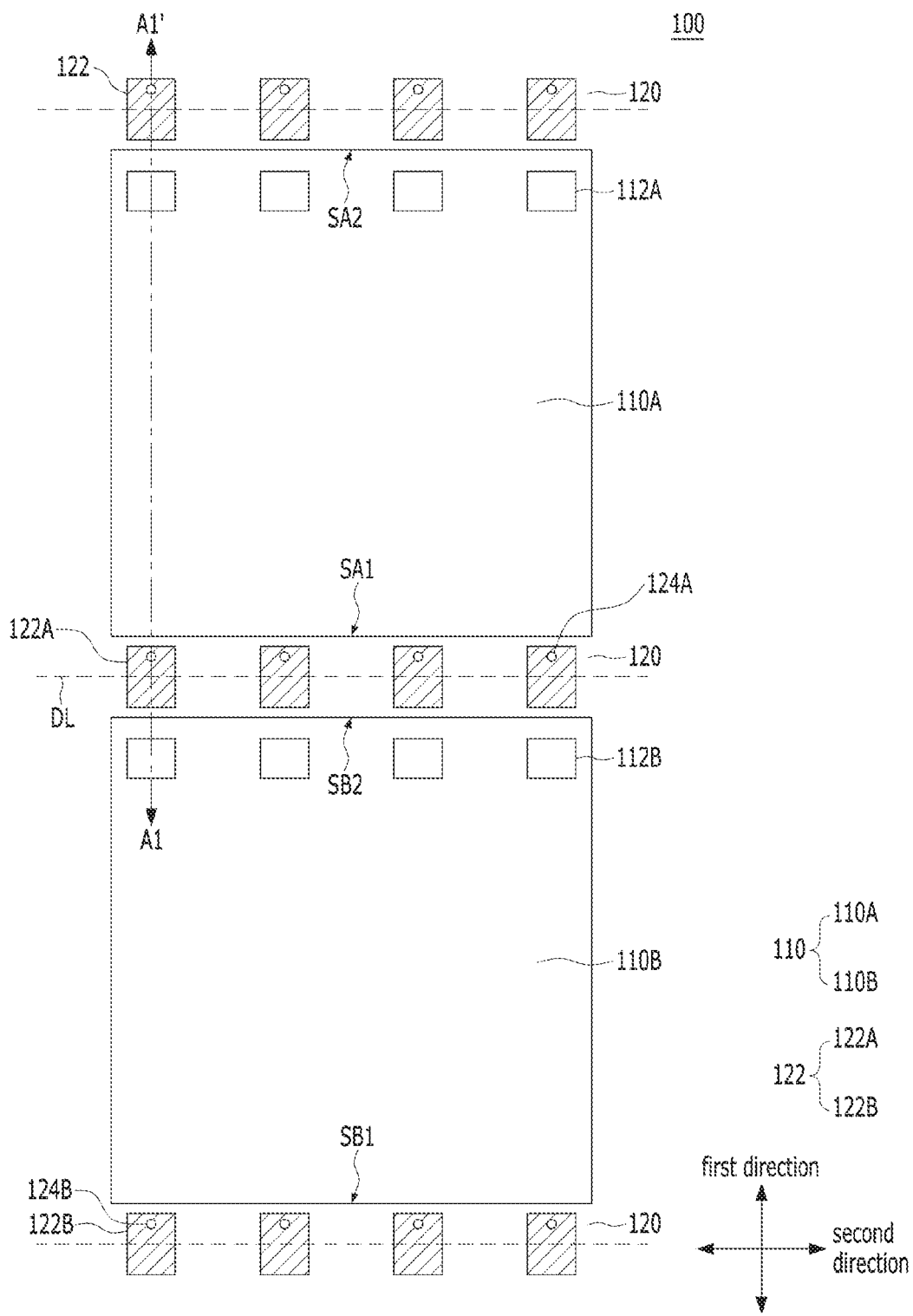
FIG. 2A is an enlarged plan view of a portion of the semiconductor wafer 100 of FIG. 1.
Figure 2B:
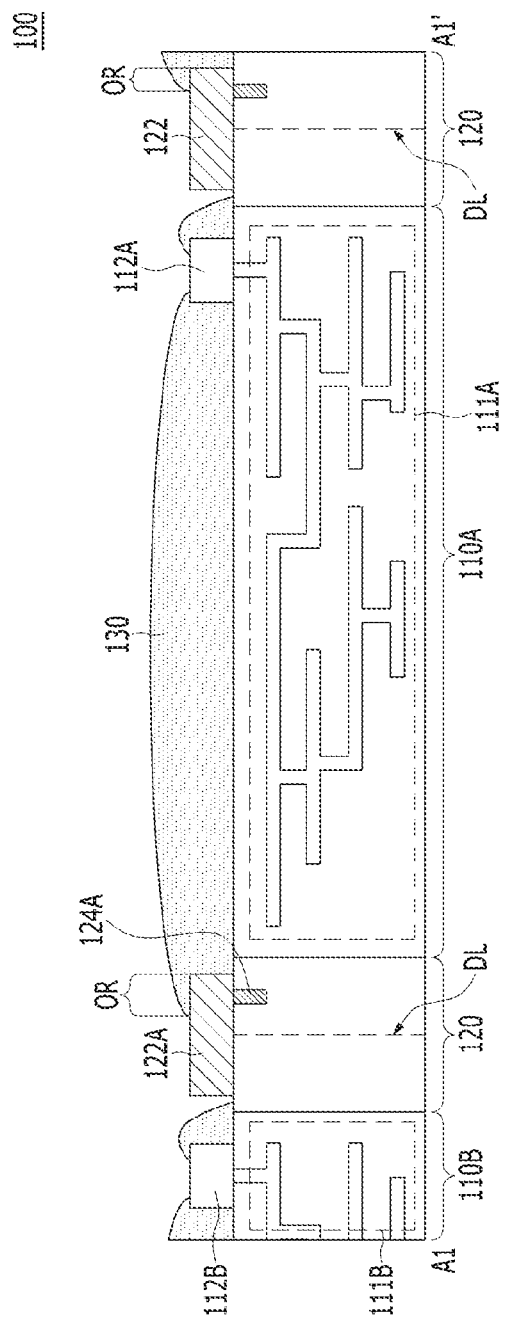
FIG. 2B is a cross-sectional view taken along a line A1-A1' of FIG. 2A.

FIG. 2A is an enlarged plan view of a portion of the semiconductor wafer 100 of FIG. 1, and FIG. 2B is a cross-sectional view taken along a line A1-A1' of FIG. 2A.

Referring to FIGS. 2A and 2B, the two chip regions 110 may be spaced apart from each other with the scribe lane region 120 interposed therebetween in the first direction. Hereinafter, the two chip regions 110 will be referred to as a first chip region 110A and a second chip region 110B.

Both sides of the first chip region 110A in the first direction will be referred to as a first side SA1 and a second side SA2, respectively. In addition, both sides of the second chip region 110E in the first direction will be referred to as a first side SB1 and a second side SB2, respectively. The first side SA1 of the first chip region 110A may be disposed to face the second side SB2 of the second chip region 110B.

The first chip region 110A may include a circuit structure 111A formed in the semiconductor wafer 100, and a first chip pad 112A which is positioned on the circuit structure 111A and electrically connected to the circuit structure 111A. In addition, the second chip region 110B may include a circuit structure 111B formed in the semiconductor wafer 100, and a second chip pad 112B which is positioned on the circuit structure 111B and electrically connected to the circuit structure 111B.

The circuit structures 111A and 111B may be variously implemented to satisfy functions required for a semiconductor chip to be formed. For example, the circuit structures 111A and 111B may include volatile memory such as dynamic random access memory (DRAM) and static RAM (SRAM), nonvolatile memory such as NAND flash, resistive RAM (RRAM), phase-change RAM (PRAM), magneto-resistive RAM (MRAM), and ferroelectric RAM (FRAM), various active devices, various passive devices, or the like. The circuit structures 111A and 111B may be identical to each other.

The first chip pad 112A may be positioned in an edge region adjacent to the second side SA2 of the first chip region 110A. Also, the second chip pad 112B may be positioned in an edge region adjacent to the second side SB2 of the second chip region 110B. For reference, the edge region adjacent to the second side SA2 of the first chip region 110A may be a region for which a distance from the second side SA2 is less than half of a width of the first chip region 110A in the first direction. In addition, the edge region adjacent to the second side SB2 of the second chip region 110B may be a region for which a distance from the second side SB2 is less than half of a width of the second chip 110E in the first direction. When the circuit structures 111A and 111E are the same, the position, arrangement, and number of the first chip pads 112A in the first chip region 110A may be the same as the position, arrangement, and number of the second chip pads 112B in the second chip region 110B. In the present embodiment, a plurality of first chip pads 112A and a plurality of second chip pads 112B may be arranged in a line along the second direction in the corresponding edge regions. In addition, in the present embodiment, four first chip pads 112A and four second chip pads 112B may be disposed in the corresponding edge regions. However, the present disclosure is not limited thereto. As long as the first chip pads 112A are located in the edge region adjacent to the second side SA2 of the first chip region 110A and the second chip pads 112B are located in the edge region adjacent to the second side SB2 of the second chip region 110B, the number and arrangement of the first and second chip pads 112A and 112B may be variously modified.

The first and second chip pads 112A and 112B may be pads for wire bonding. Also, the first and second chip pads 112A and 112B may include various metal materials or metal compounds. In the present embodiment, the first and second chip pads 112A and 112B may protrude above the upper surface of the semiconductor wafer 100, but the present disclosure is not limited thereto. As long as the first and second chip pads 112A and 112B are electrically conductive elements positioned at an uppermost portion of the first and second chip regions 110A and 110B of the semiconductor wafer 100, the cross-sectional shapes of the first and second chip pads 112A and 112B may be variously modified.

Each of the first chip region 110A and the second chip region 110B may be surrounded by the scribe lane region 120. The scribe lane region 120 positioned between the first chip region 110A and the second chip region 110B in the first direction may be shared by the first chip region 110A and the second chip region 110B. In other words, the scribe lane region 120 positioned between the first chip region 110A and the second chip region 110B in the first direction may be a region for separating the first chip region 110A and the second chip region 110B by dicing.

The scribe lane region 120 may include a test pad 122. The test pad 122 may include a first test pad 122A for evaluating characteristics of the first chip region 110A and a second test pad 122B for evaluating characteristics of the second chip region 110B. In this case, the first test pad 122A may be disposed in the scribe lane region 120 adjacent to the first side SA1 of the first chip region 110A. That is, the first test pad 122A may be disposed in the scribe lane region 120 so as to be furthest from the first chip pad 112A. Similarly, the second test pad 122B may be disposed in the scribe lane region 120 adjacent to the first side SB1 of the second chip region 110B. That is, the second test pad 122B may also be disposed in the scribe lane region 120 so as to be furthest from the second chip pad 112B. Meanwhile, the scribe lane region 120 adjacent to the first side SA1 of the first chip region 110A may also be adjacent to the second side SB2 of the second chip region 110B. For this reason, the first test pad 122A may be located in the scribe lane region 120 between the first chip region 110A and the second chip region 110B. Because the first test pad 122A is for measuring the characteristics of the first chip region 110A, and is independent of measuring the characteristics of the second chip region 110B, the first test pad 122A may move toward the first chip region 110A after a dicing process described later. For convenience of description, the test pad 122 is also shown in the scribe lane region 120 adjacent to the second side SA2 of the first chip region 110A. This test pad 122 may be for a chip region (not shown) adjacent to the second side SA2 of the first chip region 110A in the first direction.

A first contact plug 124A may be disposed under the first test pad 122A. An upper end of the first contact plug 124A may overlap and connect with the first test pad 122A. A lower end of the first contact plug 124A may be electrically connected to a circuit structure (not shown) of the scribe lane region 120, for example, a transistor of the scribe lane region 120. Similarly, a second contact plug 124B may be disposed under the second test pad 122B. An upper end of the second contact plug 124B may overlap and connect with the second test pad 122B. A lower end of the second contact plug 124B may be electrically connected to a circuit structure (not shown) of the scribe lane region 120. The scribe lane region 120 may be filled with an insulating material, except for the first and second contact plugs 124A and 124B, and a required circuit structure. Accordingly, an uppermost portion surrounding side surfaces of the first and second contact plugs 124A and 124B may also include an insulating material.

When the circuit structures 111A and 111B are the same as each other, the position, arrangement, and number of the first test pads 122A may be the same as the position, arrangement, and number of the second test pads 122B in the corresponding scribe lane regions 120. In the present embodiment, a plurality of first test pads 122A and a plurality of second test pads 122B may be arranged in a line along the second direction in the scribe lane region 120. In addition, in the present embodiment, four first test pads 122A and four second test pads 122B may be disposed in the corresponding scribe lane regions 120. However, the present disclosure is not limited thereto, and the number and arrangement of the first and second test pads 122A and 122B may be variously modified.

The test pad 122 may be a pad for contacting a probe. Further, the test pad 122 may include various metal materials or metal compounds. In the present embodiment, the test pad 122 may protrude above the upper surface of the semiconductor wafer 100, but the present disclosure is not limited thereto. The cross-sectional shape of the test pad 122 may be changed as long as the test pad 122 is an electrically conductive element positioned at an uppermost portion in the scribe lane region 120. The test pad 122 may have the same material, thickness, planar shape, and/or height as the first and second chip pads 112A and 112B. Alternatively, the test pad 122 may have a different material, thickness, planar shape, and/or height from the first and second chip pads 112A and 112B.

Meanwhile, the dicing line DL extending in the second direction may pass through the scribe lane region 120 in which the test pad 122 is disposed. Each test pad 122 may overlap the dicing line DL. In the present embodiment, the dicing line DL may be positioned in a center of the scribe lane region 120 in the first direction. However, the dicing line DL may be biased to the first sides SA1 and SB1 or the second sides SA2 and SB2 to a certain degree. In any case, the test pad 122 may overlap the dicing line DL, and may be divided into two parts in the first direction. However, in the dicing process described later, even if the semiconductor wafer 100 is cut along the dicing line DL, the test pad 122 is not cut. Although not illustrated, a dicing line extending in the first direction may pass through the scribe lane region 120 positioned at both sides of each of the first chip region 110A and the second chip region 110E in the second direction.

Figure 2C:
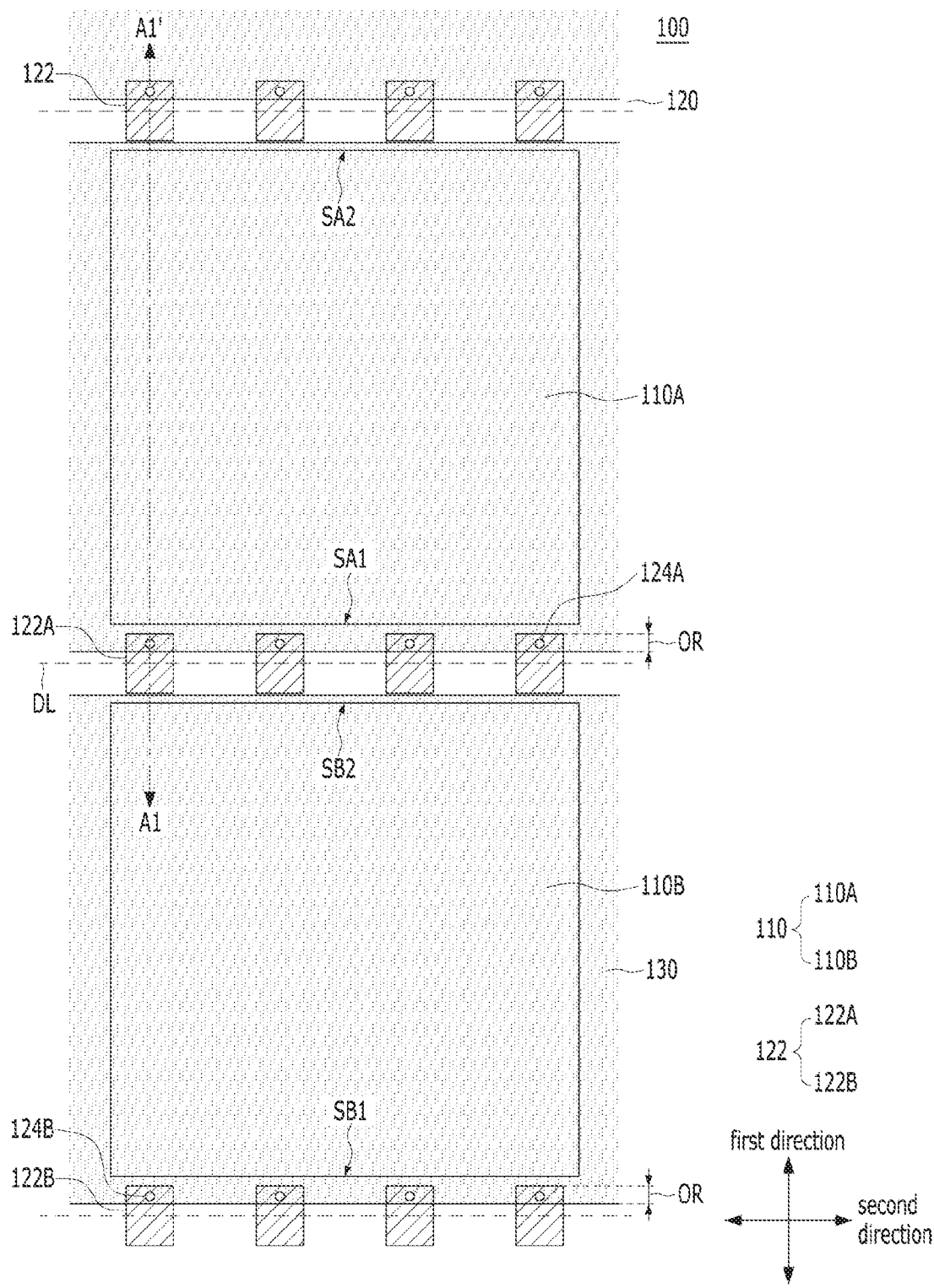
FIG. 2C is a plan view in which a protective layer 130 is further illustrated in addition to the first and second chip regions 110A and 110B and the test pad 122 of the semiconductor wafer 100 of FIG. 2A.

The first chip region 110A, the second chip region 110B, and the scribe lane region 120 described above may be covered by a protective layer 130. The protective layer 130 may be disposed over the first chip region 110A, the second chip region 110B, and the first scribe lane region 120 while partially covering the first scribe lane region 120. The protective layer 130 may have a plurality of openings exposing each of the first chip pad 112A, the second chip pad 112B, and the test pad 122. In particular, in order to clearly show the exposure relationship between the protective layer 130 and the test pad 122, FIG. 2C will be further referenced together with FIGS. 2A and 2B. FIG. 2C is a plan view in which the protective layer 130 is further illustrated, by shading, in addition to the first and second chip regions 110A and 110E and the test pad 122 of the semiconductor wafer 100 of FIG. 2A. For convenience of description, the first and second chip pads 112A and 112B, and the openings of the protective layer 130 overlapping them are omitted in FIG. 2C.

Referring to FIGS. 2A to 2C, the protective layer 130 may cover a portion of the first test pad 122A, which is adjacent to the first side SA1 in the first direction, while completely exposing a remaining portion of the first test pad 122A. That is, the remaining portion of the first test pad 122A does not contact the protective layer 130. Similarly, the protective layer 130 may cover a portion of the second test pad 122B, which is adjacent to the first side SB1 in the first direction, while completely exposing a remaining portion of the second test pad 122B. That is, the remaining portion of the second test pad 122B does not contact the protective layer 130. The portion of each of the first and second test pads 122A and 122B, which are covered by the protective layer 130, will be referred to as an overlap region OR. The protective layer 130 may serve to hold the test pad 122 overlapping itself in a process of applying a force to separate the diced regions from each other after the dicing process.

The protective layer 130 may include various insulating materials. Further, the protective layer 130 may include a polymer-based insulating material. For example, the protective layer 130 may include a polyimide material such as Polyimide Isoindro Quindzoline (PIQ).

The semiconductor wafer 100 described above may be cut along the dicing lines DL and separated into a plurality of semiconductor chips. Hereinafter, a case where the regions illustrated in FIGS. 2A and 2B are divided into two semiconductor chips will be described in more detail with reference to FIGS. 3A and 3B.

Figure 3A:
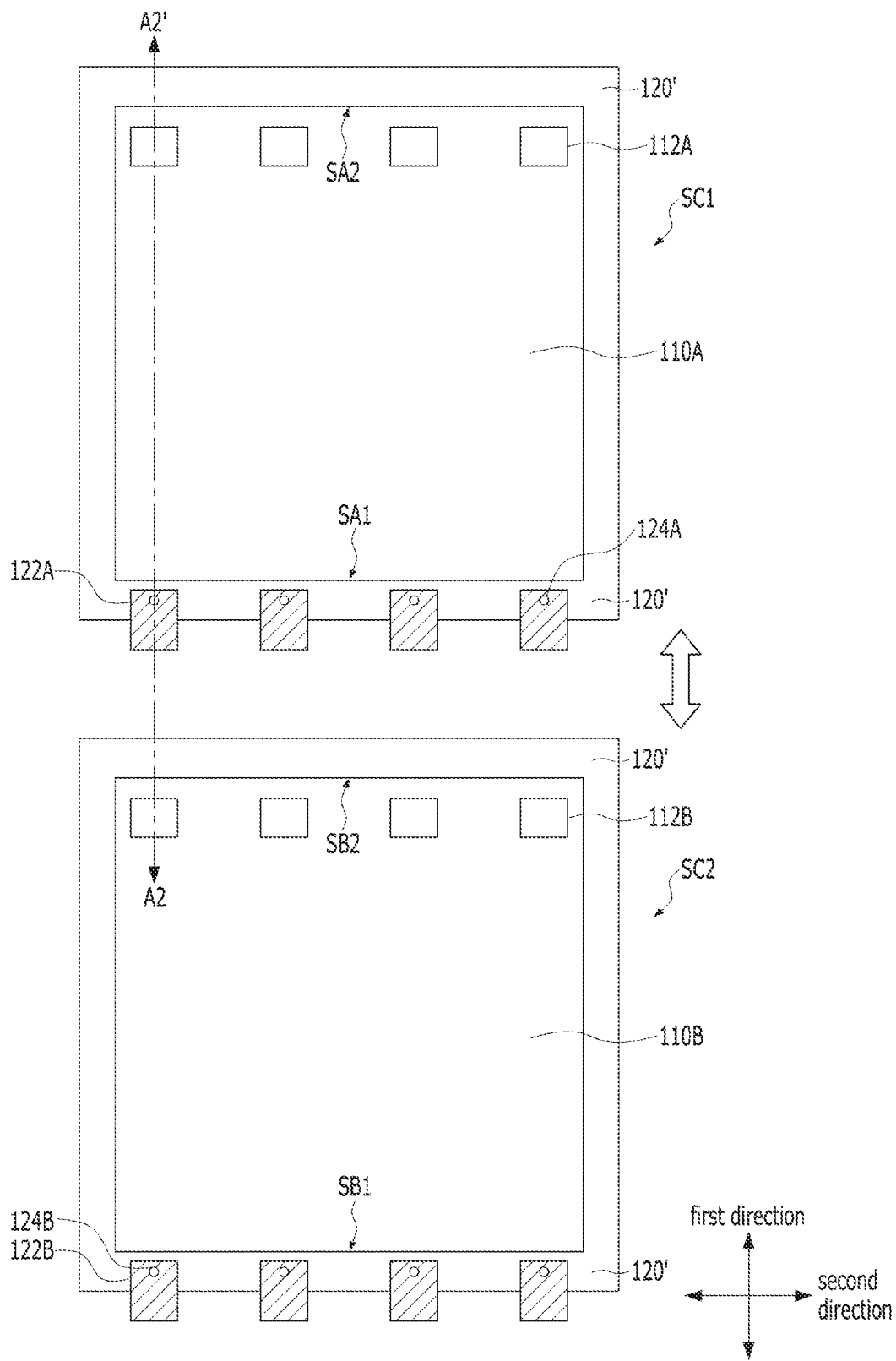
FIG. 3A is a plan view illustrating two semiconductor chips including a first chip region and a second chip region of FIG. 2A, respectively.
Figure 3B:
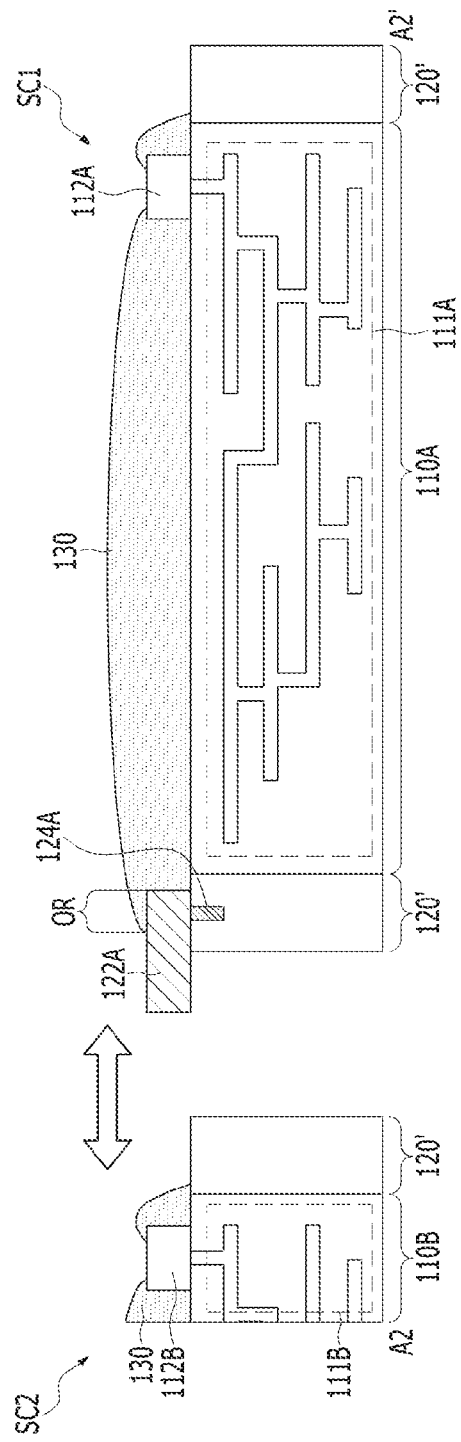
FIG. 3B is a cross-sectional view along a line A2-A2' of FIG. 3A.

FIG. 3A is a plan view illustrating two semiconductor chips including a first chip region and a second chip region of FIG. 2A, respectively. FIG. 3B is a cross-sectional view along a line A2-A2' of FIG. 3A.

Referring to FIGS. 3A and 3B, first and second semiconductor chips SC1 and SC2 may be formed by dicing the semiconductor wafer 100 along the dicing line DL of FIGS. 2A and 2B described above, and other dicing lines (not shown in FIGS. 2A and 2B) positioned at both sides of each of the first chip region 110A and the second chip region 110E in the second direction and extending in the first direction. After dicing, the first and second semiconductor chips SC1 and SC2 may be pulled apart with force in the first direction to increase the distance therebetween (see arrows), and accordingly, the first and second semiconductors chips SC1 and SC2 may be separated from each other.

As described above, the first test pad 122A is not cut in the dicing process of the semiconductor wafer 100. The first test pad 122A may include a metal layer. Because the metal layer of the first test pad 122A has a crack resistance compared to the insulating material filling the scribe lane region 120, the first test pad 122A may not be separated. That is, the first test pad 122A may keep its original form after separation of the first and second semiconductor chips SC1 and SC2. The first test pad 122A may remain coupled to the first semiconductor chip SC1 together with a portion of the scribe lane region 120 remaining after cutting, but may be separated from the second semiconductor chip SC2. The protective layer 130 covering the first chip region 110A may extend to the scribe lane region 120 adjacent to the first side SA1 of the first chip region 110A, and may overlap a portion of the first test pad 122A. On the other hand, the protective layer 130 covering the second chip region 110E may be formed so as not to overlap the first test pad 122A. Because the protective layer 130 covering the first chip region 110A overlaps a portion of the first test pad 122A and serves to fix the first test pad 122A, the first test pad 122A may be separated from the second semiconductor chip SC2, which is not fixed the first test pad 122A by the protective layer 130. In addition, the protective layer 130 including a polymer-based insulating material may more stably fix the first test pad 122A. The polymer-based insulating material may have strong resistance to tensile force, and may be stable against the impact of the separation process due to its crack resistance.

Similarly, the second test pad 122B may be coupled to the second semiconductor chip SC2, The protective layer 130 covering the second chip region 110B may overlap a portion of the second test pad 122B to fix the second test pad 122B. The test pads 122 disposed in the scribe lane region 120 adjacent to the second side SA2 of the first chip region 110A in FIGS. 2A and 2B are not shown in FIGS. 3A and 3B. The test pad 122 may be coupled to a semiconductor chip including a chip region (not shown) adjacent to the second side SA2 of the first chip region 110A, and thus, may be separated from the first semiconductor chip SC1.

As a result, the first semiconductor chip SC1 may include the first chip region 110A and a scribe lane region 120' surrounding the first chip region 110A. The scribe lane region 120' of the first semiconductor chip SC1 may include a part of the scribe lane region 120 of FIGS. 2A and 2B, The first test pad 122A may be disposed on the scribe lane region 120' adjacent to the first side SA1. A portion of the first test pad 122A may overlap the scribe lane region 120', and the rest portion may protrude out of the scribe lane region 120'. The rest portion of the first test pad 122A may protrude toward a side away from the first side SA1 in the first direction. Ail the test pads which are disposed in the scribe lane region adjacent to the second side SA2 of the first chip region 110A shown in FIGS. 2A and 2B may be separated from the first semiconductor chip SC1 in the semiconductor chip separation process. Therefore, no test pads exist in the scribe lane region 120' adjacent to the second side SA2 disposed adjacent to the first chip pad 112A. A portion of an upper surface of the scribe lane region 120' adjacent to the second side SA2 may be exposed without being covered by the protective layer 130, The contact plug is absent from the scribe lane region 120' adjacent to the second side SA2. Thus, an uppermost portion of the scribe lane region 120' may be covered by an insulating material.

Also, the second semiconductor chip SC2 may include the second chip region 110B and a scribe lane region 120' surrounding the second chip region 110B. The scribe lane region 120' of the second semiconductor chip SC2 may include a part of the scribe lane region 120 of FIGS. 2A and 2B. The second test pad 122B may be disposed on the scribe lane region 120' adjacent to the first side SB1. A portion of the second test pad 122B may overlap the scribe lane region 120', and the rest portion may protrude out of the scribe lane region 120'. The rest portion of the second test pad 112B may protrude toward a side away from the first side SB1 in the first direction. Because the first test pad 122A is separated from the second semiconductor chip SC2, no test pad exists in the scribe lane region 120' adjacent to the second side SB2 disposed adjacent to the second chip pad 112B.

The first and second semiconductor chips SC1 and SC2 having substantially the same structure may be manufactured. The plurality of chip regions 110 included in the semiconductor wafer 100 of FIG. 1 may be separated into a plurality of semiconductor chips. These semiconductor chips may include the same structures as the first and/or second semiconductor chips SC1 and SC2 of FIGS. 3A and 3B.

Effects of the semiconductor chip obtained in FIGS. 3A and 3B will be described in more detail below with reference to FIGS. 4A and 4B.

Figure 4A:
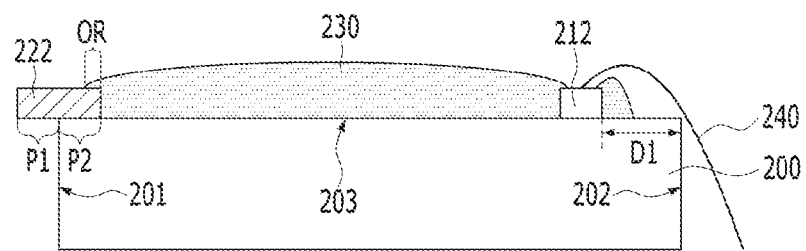
FIG. 4A is a cross-sectional view illustrating a semiconductor chip according to an embodiment of the present disclosure.
Figure 4B:
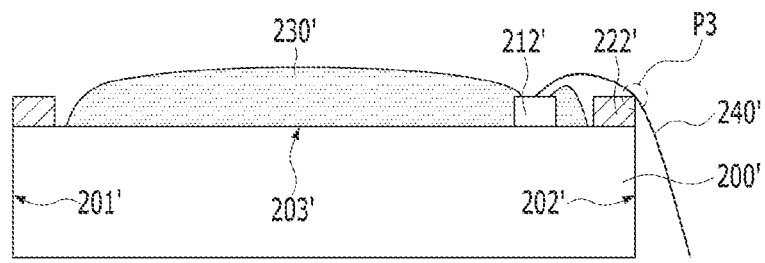
FIG. 4B is a cross-sectional view illustrating a semiconductor chip for comparison with the semiconductor chip of FIG. 4A.

FIG. 4A is a cross-sectional view illustrating a semiconductor chip according to an embodiment of the present disclosure, and FIG. 4B is a cross-sectional view illustrating a semiconductor chip for comparison with the semiconductor chip of FIG. 4A. The semiconductor chip of FIG. 4A may be substantially the same as the first semiconductor chip SC1 or the second semiconductor chip SC2 of FIGS. 3A and 3B, but is illustrated more briefly.

Referring to FIG. 4A, a semiconductor chip 200 of the present embodiment may include an upper surface 203 on which a chip pad 212 and a test pad 222 are disposed, a first side surface 201 and a second side surface 202 which are located opposite to each other while extending vertically downward from the upper surface 203, and a protective layer 230 covering the upper surface 203 while leaving the chip pad 212 and the test pad 222 exposed.

Here, the test pad 222 may be located on an edge region adjacent to the first side surface 201 of the semiconductor chip 200. A portion of the test pad 222 may overlap the semiconductor chip 200, and the rest portion of the test pad 222 may protrude outward from the first side surface 201 of the semiconductor chip 200. The rest portion of the test pad 222 that protrudes from the semiconductor chip 200 will be referred to as a protruding portion P1, and the portion of the test pad 222 that overlaps the semiconductor chip 200 will be referred to as an overlapping portion P2.

The chip pad 212 may be located in an edge region adjacent to the second side surface 202 of the semiconductor chip 200. The chip pad 212 may be separated from the second side surface 202 of the semiconductor chip 200 by a predetermined distance (see D1) toward a center of the semiconductor chip 200.

The protective layer 230 may cover a portion of the test pad 222. The portion of the test pad 222 covered by the protective layer 230 may be defined as an overlapped region OR. The overlapped region OR may be a part or all of the overlapping portion P2 of the test pad 222. The protruding portion P1 of the test pad 222 may not be covered by the protective layer 230.

In addition, the protective layer 230 may expose a part or all of an upper surface of the chip pad 212. One end of a bonding wire 240 may be bonded to the exposed upper surface of the chip pad 212. The other end of the bonding wire 240 may be connected to another component not shown.

Here, the protective layer 230 may expose a portion of a region between the chip pad 212 and the second side surface 202 (see D1), of the upper surface 203 of the semiconductor chip 200. As described above, because the uppermost portion of the scribe lane region adjacent to the chip pad (see 120' adjacent to 112A in FIG. 3B) includes an insulating material, a portion of the upper surface 203 of the semiconductor chip 200, which is left exposed by the protective layer 230, and an upper portion of the side surface 202 extending from the portion of the upper surface 203 may also be insulative. Accordingly, even if the bonding wire 240 contacts the semiconductor chip 200, insulation between the bonding wire 240 and the semiconductor chip 200 may be maintained, so that a leakage current does not occur.

Referring to FIG. 4B, the semiconductor chip 200' of the comparative example may include an upper surface 203' on which a chip pad 212' and a test pad 222' are disposed, a first side surface 201' and a second side surface 202' which are located opposite to each other while extending vertically downward from the upper surface 203', and a protective layer 230' exposing the chip pad 212' and the test pad 222' while covering the upper surface 203'.

Here, the separated test pad 222' may be located in an edge region adjacent to the first side surface 201' of the semiconductor chip 200' and an edge region adjacent to the second side surface 202' of the semiconductor chip 200'. This is because, when manufacturing the semiconductor chip 200' of the comparative example, an initial test pad positioned in a scribe lane region and overlapping a dicing line is cut during a dicing process, and cut portions, that is, the test pads 222' remain on corresponding semiconductor chips, respectively. In this case, a cut cross-section of the test pad 222' may be substantially aligned with the first side surface 201' and the second side surface 202'.

The chip pad 212' may be located in an edge region adjacent to the second side surface 202' of the semiconductor chip 200', but may be disposed closer to a center of the semiconductor chip 200' than the test pad 222' adjacent to the second side surface 202'.

The protective layer 230' may leave the test pad 222' exposed. That is, the protective layer 230' and the test pad 222' may not contact each other.

The protective layer 230' may leave exposed a part or all of the upper surface of the chip pad 212'. One end of a bonding wire 240' may be bonded to the exposed upper surface of the chip pad 212'. The other end of the bonding wire 240' may be connected to another component not shown.

In the embodiment of FIG. 4A and the comparative example of FIG. 4B described above, lowering a maximum height of a loop of each of the bonding wires 240 and 240' may reduce possibility of occurrence of a defect during a subsequent process. For example, in the case of stacking another semiconductor chip on each of the semiconductor chips 200 and 200', if the loop of the bonding wires 240 and 240' is high, the loop may be pressed by this semiconductor chip, and thus, process defects such as deformation or breakage of the bonding wires 240 and 240' may occur.

In the comparative example of FIG. 4B, when the loop height of the bonding wire 240' is lowered, the bonding wire 240' may contact the test pad 222' adjacent to the chip pad 212' (see P3), Therefore, a leakage current may occur through the test pad 222'.

On the other hand, according to the embodiment of FIG. 4A, a test pad adjacent to the chip pad 212 does not exist. This is because the test pad 222 is located opposite to the chip pad 212. Therefore, even if the loop height of the bonding wire 240 is lowered, a leakage current due to a contact between the bonding wire 240 and the test pad 222 does not occur.

As a result, according to the embodiment of FIG. 4A, it may be possible to implement a semiconductor package in which a plurality of semiconductor chips are stacked, while preventing process defects.

Figure 5:
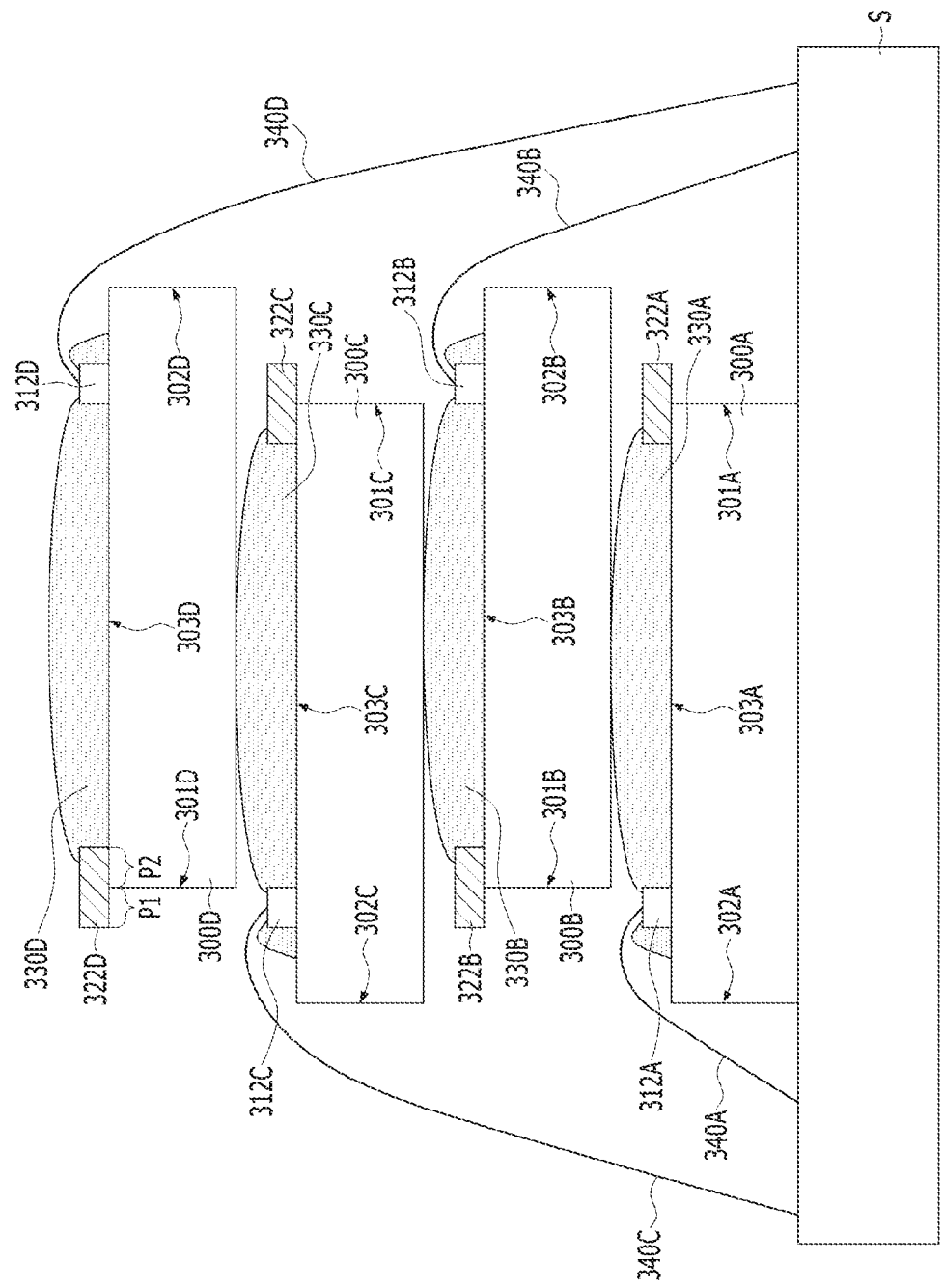
FIG. 5 is a cross-sectional view illustrating a semiconductor package according to an embodiment of the present disclosure.

FIG. 5 is a cross-sectional view illustrating a semiconductor package according to an embodiment of the present disclosure.

Referring to FIG. 5, a semiconductor package of the present embodiment may include a substrate S, and a plurality of semiconductor chips 300A, 300B, 300C, and 300D formed over the substrate S.

The substrate S may be a substrate for a semiconductor package having a circuit and/or wiring structure for transmitting power and signals. For example, the substrate S may be a printed circuit board (PCB).

The plurality of semiconductor chips 300A, 300B, 300C, and 300D will be referred to as a first semiconductor chip 300A, a second semiconductor chip 300B, a third semiconductor chip 300C, and a fourth semiconductor chip 300D according to a distance from the substrate S.

The first semiconductor chip 300A may be substantially the same as the semiconductor chip 200 of FIG. 4A described above. That is, the first semiconductor chip 300A may include an upper surface 303A on which a chip pad 312A and a test pad 322A are disposed, a first side surface 301A and a second side surface 302A positioned opposite to each other while extending vertically downward from the upper surface 303A, and a protective layer 330A exposing the chip pad 312A and the test pad 322A while covering the upper surface 303A. The first semiconductor chip 300A may be substantially the same as a state in which the semiconductor chip 200 of FIG. 4A is rotated 180 degrees around an axis in a vertical direction which is perpendicular to an upper surface of the substrate S. That is, the first semiconductor chip 300A may have a state in which left and right sides of the semiconductor chip 200 of FIG. 4A may be inverted. Accordingly, the positions of the first side surface 301A and the second side surface 302A of the first semiconductor chip 300A and the corresponding positions of the chip pad 312A and the test pad 322A may be opposite to the positions of the first side surface 201 and the second side surface 202 of the semiconductor ship 200 of FIG. 4A and the corresponding positions of the chip pad 212 and the test pad 222. The first semiconductor chip 300A may be electrically connected to the substrate S through a bonding wire 340A coupled to the chip pad 312A.

The second semiconductor chip 300B disposed over the first semiconductor chip 300A may be substantially the same as the semiconductor chip 200 of FIG. 4A described above. That is, the second semiconductor chip 300B may include an upper surface 303B on which a chip pad 312B and a test pad 322B are disposed, a first side surface 301B and a second side surface 302B positioned opposite to each other while extending vertically downward from the upper surface 303B, and a protective layer 330B exposing the chip pad 312B and the test pad 322B while covering the upper surface 303B. The second semiconductor chip 300B may be electrically connected to the substrate S through a bonding wire 340B coupled to the chip pad 312B.

In the present embodiment, the second semiconductor chip 300B may be offset stacked in one direction, for example, toward a right direction, to expose an edge region of the first semiconductor chip 300A adjacent to the second side surface 302A. The second semiconductor chip 300B may be offset stacked to expose the chip pad 312A. However, the present disclosure is not limited thereto, and the second semiconductor chip 300B may overlap the chip pad 312A. In this case, it may be necessary to lower a peak of a loop of the bonding wire 340A so that the bonding wire 340A is not pressed by the second semiconductor chip 300B. In both cases, an electrical short failure between the bonding wire 340A and the test pad 322A does not occur.

The stacked structure of the first semiconductor chip 300A and the second semiconductor chip 300B may be repeatedly implemented in the same manner even when three or more chips are stacked in the vertical direction.

As an example, as shown, a third semiconductor chip 300C substantially identical to the first semiconductor chip 300A and a fourth semiconductor chip 300D substantially identical to the second semiconductor chip 300B may be stacked over the stacked structure of the first and second semiconductor chips 300A and 300B in the same form as the stacked structure of the first and second semiconductor chips 300A and 300B. The third semiconductor chip 300C may be offset stacked in another direction, for example, toward a left direction, to expose the chip pad 312B of the second semiconductor chip 300B. The third semiconductor chip 300C may include an upper surface 303C on which a chip pad 312C and a test pad 322C are disposed, a first side surface 301C and a second side surface 302C positioned opposite to each other while extending vertically downward from the upper surface 303C, and a protective layer 330C exposing the chip pad 312C and the test pad 322C while covering the upper surface 303C. The fourth semiconductor chip 300D may include an upper surface 303D on which a chip pad 312D and a test pad 322D are disposed, a first side surface 301D and a second side surface 302D positioned opposite to each other while extending vertically downward from the upper surface 303D, and a protective layer 330D exposing the chip pad 312D and the test pad 322D while covering the upper surface 303D. The third semiconductor chip 300C may be electrically connected to the substrate S through a bonding wire 340C, and the fourth semiconductor chip 300D may be electrically connected to the substrate S through a bonding wire 340D.

Each of the test pads 322A, 322B, 322C, and 322D may include a protruding portion P1 protruding from each of the semiconductor chips 300A, 300B, 300C, and 300D, respectively, and an overlapping portion P2 overlapping each of the semiconductor chips 300A, 300B, 300C, and 300D, respectively.

In the present embodiment, the stacked structure of the four semiconductor chips 300A, 300B, 300C, and 300D has been described, but the present disclosure is not limited thereto. A semiconductor package of the present embodiment may include any number of semiconductor chips that are the same as the semiconductor chip 400 of FIG. 4A. According to the present embodiment, because stacking a large number of semiconductor chips is facilitated, a highly integrated semiconductor package including a large number of stacked semiconductor chips may be implemented.

Figure 6:
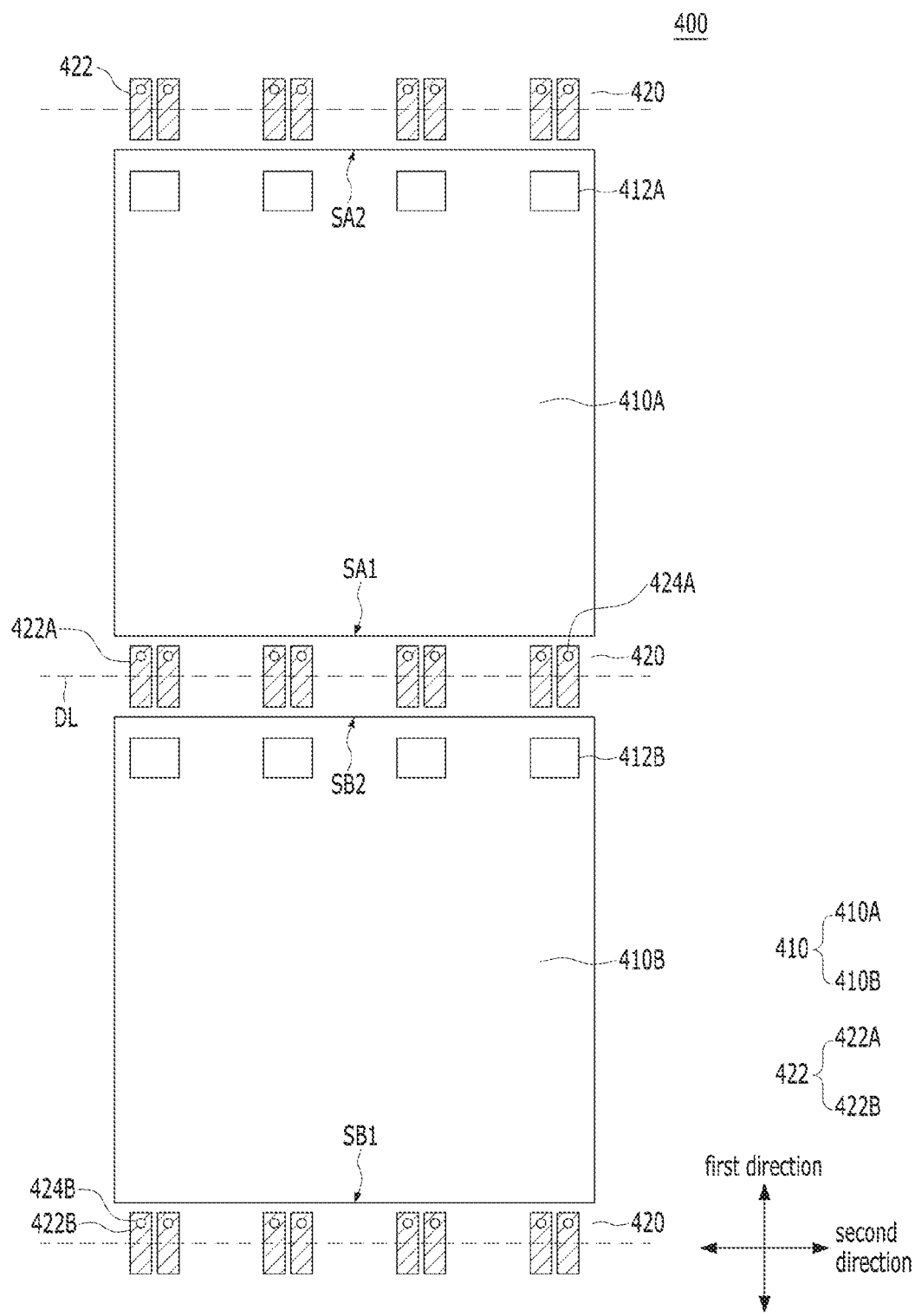
FIG. 6 is an enlarged plan view of a part of a semiconductor wafer according to another embodiment of the present disclosure.

FIG. 6 is an enlarged plan view of a part of a semiconductor wafer according to another embodiment of the present disclosure. FIG. 6 may be compared to FIG. 2A. Hereinafter, a description will be made focusing on differences from the embodiment of FIG. 2A, and detailed descriptions of substantially the same parts will be omitted.

Referring to FIG. 6, the semiconductor wafer 400 of the present embodiment may include a first chip region 410A and a second chip region 410B arranged spaced apart from each other with a scribe lane region 420 interposed therebetween in a first direction.

A first chip pad 412A may be located in an edge region adjacent to a second side SA2 of the first chip region 410A. Also, a second chip pad 412B may be located in an edge region adjacent to a second side SB2 of the second chip region 410B.

A first test pad 422A may be disposed in the scribe lane region 420 adjacent to a first side SA1 of the first chip region 410A. A second test pad 422B may be disposed in the scribe lane region 420 adjacent to a first side SB1 of the second chip region 410B.

Here, each of the first test pad 422A and the second test pad 422B may include two or more portions separated from each other in a second direction. In the present embodiment, each of the first test pad 422A and the second test pad 422B may include two portions, but in another embodiment, each of the first test pad 422A and the second test pad 422B may include three or more portions separated from each other in the second direction.

In this case, a first contact plug 424A connected to the first test pad 422A may be formed to overlap and connect with each of two or more portions of the first test pad 422A. Also, a second contact plug 424B connected to the second test pad 422B may be formed to overlap and connect with each of two or more portions of the second test pad 422B.

In the present embodiment, because the contact area between each test pad and the semiconductor wafer is small, in the process of separating the semiconductor wafer into a plurality of semiconductor chips, each test pad to be combined with a specific semiconductor chip may be separated from other semiconductor chips more easily.

Figure 7:
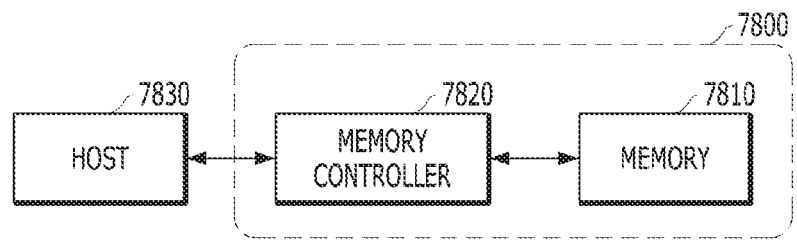
FIG. 7 shows a block diagram illustrating an electronic system employing a memory card including a semiconductor package, according to an embodiment.

FIG. 7 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 8:
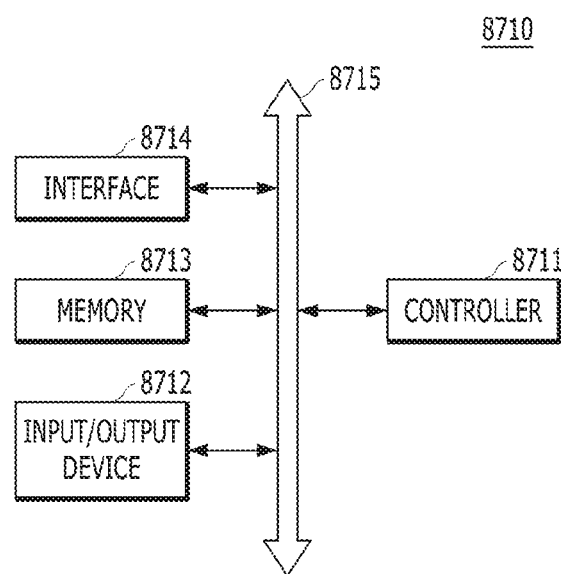
FIG. 8 shows a block diagram illustrating another electronic system including a semiconductor package, according to an embodiment.

FIG. 8 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an TO antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the disclosure as defined in the following claims.

What is claimed is:

1. A semiconductor chip, which includes an upper surface, a first side surface, and a second side surface positioned opposite to the first side surface, comprising:
    a test pad disposed on the upper surface and in an edge region adjacent to the first side surface;
    a chip pad disposed on the upper surface and in an edge region adjacent to the second side surface; and
    a protective layer covering the upper surface and leaving at least a portion of the chip pad exposed,
    wherein the test pad includes an overlapping portion overlapping the upper surface and a protruding portion protruding from the first side surface toward an outside of the semiconductor chip, and
    wherein the protective layer covers at least a portion of the overlapping portion of the test pad.

2. The semiconductor chip according to claim 1, wherein the protective layer leaves the protruding portion of the test pad exposed.

3. The semiconductor chip according to claim 1,
    wherein the chip pad is spaced a distance from the second side surface toward a center of the semiconductor chip.

4. The semiconductor chip according to claim 1,
    wherein the chip pad is spaced a distance from the second side surface toward a center of the semiconductor chip, and
    wherein the protective layer leaves a portion of the upper surface between the chip pad and the second side surface exposed.

5. The semiconductor chip according to claim 4,
    wherein the portion of the upper surface left exposed by the protective layer between the chip pad and the second side surface comprises an insulating material.

6. The semiconductor chip according to claim 1,
    wherein the chip pad is a wire bonding pad.

7. The semiconductor chip according to claim 1,
    wherein the semiconductor chip includes a chip region and a scribe lane region surrounding the chip region; and
    wherein the test pad overlaps the scribe lane region and is electrically separated from the chip region.

8. The semiconductor chip according to claim 1,
    wherein the protective layer includes a polymer-based insulating material.

9. A semiconductor package comprising:
    a substrate; and a plurality of semiconductor chips stacked in a vertical direction over the substrate, each of the plurality of semiconductor chips having an upper surface, a first side surface, and a second side surface positioned opposite to the first side surface, wherein each of the plurality of semiconductor chips comprises:

a test pad disposed on the upper surface and in an edge region of the semiconductor chip adjacent to the first side surface; and a chip pad disposed on the upper surface and in an edge region of the semiconductor chip adjacent to the second side surface, wherein the test pad for each of the semiconductor chips includes an overlapping portion overlapping the upper surface and a protruding portion protruding from the first side surface toward an outside of the semiconductor chip, and wherein each of the plurality of semiconductor chips further includes a protective layer covering the upper surface and leaving at least a portion of the chip pad exposed, and the protective layer covers at least a portion of the overlapping portion of the test pad.

10. The semiconductor package according to claim 9, further comprising:

a bonding wire electrically connecting the chip pad and the substrate.

11. The semiconductor package according to claim 9, wherein the plurality of semiconductor chips includes a first semiconductor chip and a second semiconductor chip having the same configuration and positioned adjacent to each other in the vertical direction; and wherein the second semiconductor chip is rotated by 180 degrees about the vertical direction in a horizontal plane with respect to the first semiconductor chip.

12. The semiconductor package according to claim 9, wherein the protective layer leaves the protruding portion of the test pad exposed.

13. The semiconductor package according to claim 9, wherein the chip pad is spaced a distance from the second side surface toward a center of the semiconductor chip.

14. The semiconductor package according to claim 9, wherein the chip pad is spaced a distance from the second side surface toward a center of the semiconductor chip, and wherein the protective layer leaves a portion of the upper surface between the chip pad and the second side surface exposed.

15. The semiconductor package according to claim 14, wherein the portion of the upper surface left exposed by the protective layer between the chip pad and the second side surface comprises an insulating material.

16. The semiconductor package according to claim 9, wherein each of the plurality of semiconductor chips includes a chip region and a scribe lane region surrounding the chip region; and wherein the test pad for each of the plurality of semiconductor chips overlaps the scribe lane region and is electrically separated from the chip region.

17. The semiconductor package according to claim 9, wherein the protective layer includes a polymer-based insulating material.

* * * * *